United States Patent [19]

Brownridge

[11] Patent Number: 5,122,699
[45] Date of Patent: Jun. 16, 1992

[54] LOW TEMPERATURE FIELD PRODUCER

[75] Inventor: James D. Brownridge, Binghamton, N.Y.

[73] Assignee: State University of New York, Albany, N.Y.

[21] Appl. No.: 153,062

[22] Filed: Feb. 8, 1988

[51] Int. Cl.⁵ .................... H02K 55/00; H02N 3/00
[52] U.S. Cl. ............................. 310/306; 505/701
[58] Field of Search ................. 310/306; 505/1, 701

[56] References Cited

U.S. PATENT DOCUMENTS

| | | | |
|---|---|---|---|
| 3,586,439 | 6/1971 | Treharne et al. | 356/43 |
| 3,654,466 | 4/1972 | Abrams et al. | 250/83.3 |
| 3,733,499 | 5/1973 | Deis et al. | 310/4 |
| 3,769,096 | 10/1973 | Ashkin et al. | 136/213 |
| 3,840,748 | 10/1974 | Braunlich | 250/423 |
| 4,634,913 | 1/1987 | Whatmore et al. | 310/313 |
| 4,648,991 | 3/1987 | Fang et al. | 310/306 |
| 4,973,874 | 11/1990 | Carr, Jr. | 310/306 |

OTHER PUBLICATIONS

Sourcebook of Pyroelectricity, (1974), Sidney B. Lang, pp. 28-46 and pp. 68-78 and pp. 167, 176, 177 and 192.
Acta Crystallographica (1962) vol. 15, pp. 974-976.
Acta Crystallographica (1962) vol. B38, pp. 2353-2357.
Acta Crystallographica (1983) vol. C39, pp. 1591-1594.
Phys. Stat. Sol. 31, (1969), pp. 799-806.
Journal of the Physical Society of Japan, vol. 28, (1970).
Journal of Applied Physics, vol. 39, No. 6 (1968), pp. 2904-2908.
Rubin, L. G., "Cryogenic Thermometry", Cryogenics, vol. 10, No. 14, Feb. 1970, pp. 14-21.

*Primary Examiner*—Steven L. Stephan
*Assistant Examiner*—D. L. Websch
*Attorney, Agent, or Firm*—Michael L. Dunn; Robert P. Simpson; William J. Crossetta, Jr.

[57] ABSTRACT

A process for the formation of a force field comprising cooling at least one crystal selected from potassium tartrate, cesium nitrate, rubidium nitrate, tartaric acid, cadmium nitrate and thorium nitrate to a temperature below about 110K. The force field comprises an electric field and a mass attraction field which maintains its intensity over long time periods. The crystal is encapsulated in, e.g., nonconductive epoxy.

15 Claims, No Drawings

LOW TEMPERATURE FIELD PRODUCER

BACKGROUND OF THE INVENTION

In the last several decades there has been increasing interest in the study of pyroelectricity and its utility in environmental detection, laser transmission and the like. By pyroelectricity is meant that property of certain crystals to produce a state of electric polarization by a change in temperature.

The phenomenon of pyroelectricity is well described in the literature (e.g. Sidney B. Lang, Sourcebook of Pyroelectricity, Gordon and Breach Science Publishers, New York, 1974). The effect appears to result from the enharmonic ionic vibration of crystals lacking a center of symmetry. Typically the effect is attained by rapidly increasing or decreasing the temperature of an appropriate crystal, substantially above ambient, which in turn will spontaneously generate a voltage along a polar axis of the crystal. Typically also when the temperature of such crystal is then maintained constant, voltage generation ceases and any voltage which may have been built up immediately dissipates, with the crystal becoming externally electrically neutral.

The utility of pyroelectric crystals in the prior art has generally closely followed the typical aforedescribed experience with the phenomenon. Heat detection or light and radiation detection, wherein crystal will be caused to undergo a temperature change by exposure to heat light or radiation, have become the major utilities of pyroelectrics. The voltage generated by a temperature change is measured to quantify heat, light or radiation change. Such utilities are commercially important, but the inability of present pyroelectric crystals to store the voltage generated, together with the typical necessity of elevation of temperature above ambient to achieve an effect in such crystals has been a severe limitation to their practical application.

SUMMARY OF THE INVENTION

The present invention relates to a process for the formation of a force field, comprising cooling at least one crystal of a cryogenic field material such as those selected from $K_2C_4H_4O_6 \cdot XH_2O$ $CsNO_3$, $H_6O_6C_4$, $RbNO_3$, $Cd(NO_3)_2 \cdot XH_2O$, $Th(NO_3)_4 \cdot XH_2O$ and mixtures thereof, wherein $XH_2O$ denotes water of hydration, to temperatures below about 110K, preferably below about 85K. The force field of the present invention comprises an electrical field, being a state of electric polarity in the crystals and further comprises a mass attraction field which attracts various diverse matter.

In accord with the above-identified process a force field device is also provided comprising at least one cryogenic field material preferably comprising a crystal selected from $K_2C_4H_4O_6 \cdot XH_2O$, $CsNO_3$, $H_6O_6C_4$, $Cd(NO_3)_2 \cdot XH_2O$, $RbNO_3$ and $Th(NO_3)_4 \cdot XH_2O$ maintained at a temperature below about 260K.

One object of the invention is to provide a process and device for the generation of an electric field. Another object is to provide a device for storing an electric charge. A further object is to provide a process and device for the generation of a force field capable of attracting mass. A still further object is to provide a device comprising a stored attractive force. These and other objects of the invention will become apparent from the following recitation of the invention.

DETAILED DESCRIPTION OF THE INVENTION

The present invention relates to the generation of an electrical phenomenon which has been found to occur upon the cooling of a cryogenic field material, such as crystals of $K_2C_4H_4O_6 \cdot XH_2O$, $CsNO_3$, $H_6O_6C_4$, $Cd(NO_3)_2 \cdot XH_2O$, $RbNO_3$ and $Th(NO_3)_4 \cdot XH_2O$ to temperatures below about 260K.

Cryogenic field material, as used herein, is a material which when encapsulated in an insulating substance and introduced into a cryogenic environment develops a stable polarized field having electrostatic effects. Generally, the stability is maintained for more than about five seconds, preferably more than about a minute and most preferably more than about an hour.

It has been found that when cryogenic field materials such as crystals of $K_2C_4H_4O_6 \cdot XH_2O$, $CsNO_3$, $H_6O_6C_4$, $RbNO_3$, $Cd(NO_3)_2 \cdot XH_2O$ and $Th(NO_3)_4 \cdot XH_2O$ are cooled to temperatures below about 110K that two phenomenon appear to occur simultaneously. An electric field appears to be spontaneously generated therein comprising a voltage, with each crystal comprising a definite positive and negative pole. As the temperature of the crystal is lowered from about 110K the field strength increases, typically attaining its maximum strength at below about 78K. The spontaneous generation of an electric field, in itself, is not unknown to other crystals but typically, such other crystals require heating from ambient temperature/ and when they are temperature stabilized, the electric field immediately, or at least very rapidly, dissipates. In the process of the present invention it has been found that when the environmental temperature is stabilized, the cryogenic field material appears to act as a storage device and remains electrically polarized, without substantial degradation, over long periods of time, typically at least a day and generally more than a week, as long as the environmental temperature is maintained low. By low environmental temperature is meant temperature below about room temperature, preferably below about 273K and most preferably below about 260K. The cryogenic field materials emit light and voltage pulses of high intensity when connected to a voltage measuring instrument. The intensity of the charge and the longevity of the storage in an insulated environment comprise very surprising results. It is speculated that the failure of the electric field to rapidly discharge at low temperatures results from a high electric insulator effect of the cryogenic field material which acts to prevent the neutralizing effect of ions and electrons moving between the charged poles.

The second phenomenon on which appears to be spontaneously generated with the cooling of the aforeidentified cryogenic field material is that of mass attraction. It has been found that co-existent with the formation of an electrical field during the cooling of these materials in an insulated environment is the formation of a mass attraction effect by the crystals. Again, the formation of an attractive force by select other crystals is not unknown but typically such attraction dissipates when the crystal temperature stabilizes. It has been found that when the above-identified crystals have been cooled, as described, that they attract many different types of materials including materials typically not attracted by a magnet. Thus, the crystals appear to have a mass attracting phenomenon which cannot be explained as magnetic attraction. The reason for such attraction is unknown, however it is believed to be an induced electrostatic charge on the polar surfaces of these crystals caused by the low temperature spontaneous polarization.

It has been found that when crystals of the above-identified cryogenic field material are encapsulated in a suitable nonconductive material, and the device formed therefrom is cooled to the low temperatures before disclosed, that many different materials will be attracted to it as long as the mass attraction field of the device is not discharged or heated above the low temperatures of the invention. For example, a single crystal of $K_2C_4H_4O_6 \cdot XH_2O$, $CsNO_3$, $H_6O_6C_4$, $RbNO_3$, $Cd(NO_3)_2 \cdot XH_2O$ or $Th(NO_3)_4 \cdot XH_2O$, encapsulated in a nonconductive epoxy and placed in liquid nitrogen at about 78K, develops a stable polarized field which will attract a lead ball many times the weight of such crystal and the lead ball will cling to the epoxy surface for more than about a week and even several months, not releasing until being physically separated or the field is discharged. Similarly, ice crystals contained in a liquid nitrogen medium are immediately attracted to and move through the medium to a single crystal of epoxy encapsulated $CsNO_3$ or polycrystalline $CsNO_3$ when it is placed in the medium. In similar tests, iron filings, pieces of copper, Teflon, charcoal, polyvinyl chlorine, polyacrylate and glass beads are attracted to charged crystals of the invention in low temperature environment. In each instance, the stable charged state of the crystal maintained itself more than about 24 hours until being deliberately discharged by the experimenter.

Thus, the process and device of this invention have multiple utilities in addition to those typically associated with pyroelectrics. The exceptionally high attraction force for other materials can be used to remove undesired elements from low temperature solutions or gases. In the cryogenic environment of outer space, the device can be used to attract particulate or other materials that might otherwise create problems in sensitive instrumentation or low temperature processes. The attractive phenomenon of large and/or multiple crystals directionally focused to large bodies of mass can provide a means of locomotion in a cryogenic space environment. The attractive phenomenon of multiple crystals can comprise a support means for near frictionless travel much as a permanent magnet support means would function, with or without the option of terminating or reinitiating the attractive force. The high intensity of the voltage and light pulse emitted can also be utilized in multiple different applications. For example, in a low temperature space environment, the voltage and/or light pulse might be used in lasers, telescopes or a myriad of other devices. Temperature change can be accomplished by alternate shielding and exposure of the crystals to the sun's rays. A fully charged crystal can be shielded from the sun's heat until discharge is desired, then exposed to the sun's rays to increase its temperature, and shielded for recharging. Thus, the processes for generating a voltage charge and/or attractive force, with a device of the invention, have multiple uses.

Generally, it was found that the size, shape and method of manufacture of the potassium tartrate hydrate, cesium nitrate, rubidium nitrate, tartaric acid, cadmium nitrate hydrate and thorium nitrate hydrate crystals were not critical to the device and process of the present application. Indeed, even partial crystals and ground material were found to create a force field though the intensity of the voltage charge and mass attraction force were somewhat less than attainable with larger whole crystals of material. The presence of water of hydration in the potassium tartrate, cadmium nitrate and thorium nitrate can vary greatly. Both the potassium tartrate hemi-and di-hydrate are preferred, along with the cadmium nitrate and thorium nitrate tetra-hydrates.

Generally, crystals can be suitably manufactured by merely preparing a supersaturated aqueous solution of the finely ground material and slowly evaporating off the water over a two to four week period. A preferred method of manufacture is to supersaturate heated water, preferably boiling water, with the material and then cool the aqueous solution to room temperature, in a sealed chamber, over an eight hour or more time period. Another method of manufacture is to melt finely powdered material on a flat surface, which then forms a thin crystalline coating upon cooling. Good results were obtained with several materials using thin pieces of crystalline material obtained by the latter method.

The device of the present application can comprise one or more crystals of the materials of the invention. A mixture of one or more crystals of the present invention can be used or a mixture of one or more crystals of the present invention with one or more crystals of other materials can be used. The device is preferably encapsulated in a nonconductive material such as an epoxy resin or the like, but need not be. The poles of the crystal can be electrically wired and multiple crystals can be connected for maximizing the intensity of a discharge. Charging and discharging of the crystals releases both an electric and light pulse. Electric potentials have been measured which are greater than 1,600 Volts across single crystals of various materials. Light pulses from single crystals have been measured with photometric tubes connected to fiber optic cables several meters long.

The following examples are provided to demonstrate the method and device of the present invention and are not meant to define limitations thereof.

EXAMPLE I (A) A super saturated solution was prepared comprising powdered cesium nitrate (99% purity) in water. The water was allowed to slowly evaporate at room temperature and multiple single crystals of $CsNO_3$ were grown and recovered therefrom in about two(2) weeks.

(B) A super saturated solution comprising powdered $RbNO_3$ (99% pure) in water was allowed to slowly evaporate at room temperature and multiple single crystals of $RbNO_3$ were grown and recovered therefrom in about three weeks.

(C) In a similar manner to (A), a super saturated solution of powdered potassium tartrate hemihydrate (99% pure) in water was allowed to slowly evaporate and multiple single crystals of potassium tartrate hemihydrate were recovered.

(D) In a similar manner to (A), a super saturated solution of $Th(NO_3)_4 \cdot 4H_2O$ (99% pure) in water was allowed to slowly evaporate at room temperature and multiple single crystals of $Th(NO_3)_4 \cdot 4H_2O$ were covered.

EXAMPLE II

Powdered cesium nitrate (99% pure) was added to boiling water in an amount sufficient to form a super saturated solution. The solution was slowly cooled to room temperature over a twelve hour period of time. Multiple crystals of CsNO₃ were recovered.

EXAMPLE III (A) Powdered rubidium nitrate (99% pure) was oven heated on a glass plate to melting temperature. The melted product was removed form the oven and allowed to cool to room temperature, forming a thin, crystalline sheet.

(B) Powdered cesium nitrate (99% pure) was oven heated on a copper plate to melting temperature. The melted product was removed from the oven and allowed to cool to room temperature forming a thin, crystalline cesium nitrate sheet.

EXAMPLE IV

A cryostat, with viewing window, containing a stainless steel liquid nitrogen coldfinger of approximately four inches in length and one inch in diameter in the internal vacuum chamber was assembled. The coldfinger was bent in an "L" configuration and had attached to its terminal end, a copper wire surrounded by an electrically powered heating element. A temperature monitor was also mounted in the internal chamber, proximate the copper wire, for measuring environmental temperature of the vacuum chamber. A liquid nitrogen reservoir was attached directly to the coldfinger and further comprised a metering device for liquid nitrogen such that the coldfinger could be constantly maintained filled with liquid nitrogen.

A single crystal of CsNO₃, prepared in accordance with Example II and measuring approximately $1 \times 2 \times 4$ mm was coated with a nonconductive epoxy and attached to the end of the copper wire extending into the internal chamber from the coldfinger. Pieces of charcoal were placed in the internal chamber of the cryostat, proximate the coated crystal, and the internal chamber was evacuated to about $1 \times 10^{-6}$ torr. Liquid nitrogen was metered into the coldfinger until it was full. The environmental temperature of the internal chamber rapidly moved from ambient to about 78K. The charcoal was attracted to the crystal and clung thereto. After several hours, the electrically powered heating element was activated. As the temperature of the internal chamber environment moved upward, larger pieces of charcoal dropped off the crystal and at temperatures exceeding about 120K all the charcoal had dropped from the crystal. The heating element was turned off, the environmental temperature cooled quickly to about 77K and particles of charcoal were again attracted to the crystal. This process of cooling and heating was repeated several times with the same result and no apparent significant loss in attractive field strength of the crystal.

Using the above-identified apparatus and procedure, small pieces of copper, Teflon, polyvinyl chlorine, polyacrylate, iron and glass were placed in the internal chamber and the temperature of the crystal lowered as indicated. In each instance, the diverse materials were attracted to the crystal and dropped off only when the temperature was significantly raised. As was observed with the charcoal pieces, repeated heating and cooling of the crystal resulted in dropping off and re-attaching of the material without apparent significant loss in attractive field strength of the crystal.

EXAMPLE V

Crystals of rubidium nitrate, tartaric acid, potassium tartrate hemihydrate, cadmium nitrate tetrahydrate and thorium nitrate tetrahydrate, prepared in accord with Example I(B)-(D) were attached to the end of the copper wire of the cryostat described in Example IV. Using the procedure of Example IV, pieces of copper, Teflon, iron, glass and charcoal were alternately placed in the internal chamber of the cryostat and the temperature of the crystal was lowered to about 77K as indicated. In each instance, the various diverse materials were attracted to the crystal and dropped off only when the temperature was raised. Repeated heating and cooling of the crystals resulted in dropping off and re-attaching of the diverse materials without apparent significant loss in attractive field strength of the crystals.

EXAMPLE VI

A single crystal of CsNO₃ was prepared by the method of Example II having a thickness of 0.7 mm, length 8.0 mm and width 5.0 mm. The crystal weighed 0.0354 grams. The crystal was coated with a nonconductive epoxy and heat cured at about 94° C. The crystal was mounted at the end of a glass rod and lowered into a container of liquid nitrogen, being maintained there until its temperature stabilized at about 77K. A piece of lead, weighing 6.011 grams, was also placed in the liquid nitrogen proximate the crystal. The lead piece was attracted to the crystal and remained suspended on the crystal as the crystal was moved about in the medium. The lead piece detached when the crystal was removed from the medium and the crystal was allowed to heat up over about 100K. The lift ratio in the medium was determined to be 170:1 based upon the weight of the crystal and the lead piece.

EXAMPLE VII

A mixture of powdered RbNO₃ and CsNO₃ was heated to melting in accord with Example III and a thin crystalline sheet of combined material was recovered. A piece of the recovered crystalline sheet was prepared and tested in accord with the Example VI, and the lift ratio of lead was determined to be about 257:1 in liquid nitrogen (78K).

EXAMPLE VIII

Equal weights of cesium nitrate and potassium tartrate hemihydrate crystals, prepared in accordance with Example I(A) and (C), were crushed to particle size less than about 1.0 mm and mixed together with a nonconductive epoxy to form a circular wafer about 1.0 mm thick and 25.0 mm in diameter. The wafer was suspended in a cryogenic environment and various materials were placed in the environment proximate the wafer. The environmental temperature was reduced to about 77K by metering liquid nitrogen therein. The materials were attracted to the wafer and remained suspended therefrom. The environmental temperature was increased and the temperature at which the various materials detached from the wafer was as set out in Table I.

TABLE I

| MATERIAL | WEIGHT | TEMP. OF DETACHMENT (K.) |
| --- | --- | --- |
| Aluminum | 4.19 g | 132 |
| Copper (block) | 58.0 g | 104 |
| Aluminum | 36.0 g | 108 |

TABLE I-continued

| MATERIAL | WEIGHT | TEMP. OF DETACHMENT (K.) |
|---|---|---|
| Plexiglass | 1.8 g | 260 |
| Copper (disk) | 33.0 g | 105 |
| Copper (sheet) | 2.4 g | 140 |

EXAMPLE IX

A crystal of $CsNO_3$, prepared in accord with Example II, being approximately 15.0 mm long, 2 mm wide and about 0.6 mm thick, was coated with nonconductive epoxy. To one end of the coated crystal was affixed a conductive silver epoxy coating and a copper wire lead thus forming a capacitive coupling with the crystal. The coated crystal was immersed in liquid nitrogen and voltage pulses were measured from the copper wire lead, using an oscilloscope, having a duration of about 0.25 micro sec at amplitudes up to about 0.3 volts. The intensity of the amplitude is surprising.

EXAMPLE X

A crystal of $CsNO_3$, was prepared in accord with Example II, being approximately 15.0 mm long, 2 mm wide and about 0.6 mm thick. At one end thereof, a copper lead wire was connected using silver conductive epoxy. The thus configured crystal was coated with a nonconductive epoxy and immersed in liquid nitrogen. The copper lead wire was connected to one lead of an ammeter with the other lead of the ammeter being connected to ground. The current spontaneously generated in the crystal during cooling was measured. A current intensity of $1.0 \times 10^{-10}$ amperes was measured.

EXAMPLE XI

A crystal of $CsNO_3$ was prepared in accord with Example II, being approximately 15 mm long, 2 mm wide and about 0.6 mm thick. At both ends of the crystal, copper lead wires were connected using conductive silver epoxy. The thus configured crystal was coated with nonconductive epoxy and one copper lead wire was connected to one lead of a resistor of known value. An ammeter was connected to the other lead of the resistor and to the other copper lead from one other side of the crystal. The crystal was immersed in liquid nitrogen and the spontaneously generated voltage of the polarized crystal was calculated to be approximately 1,600 volts.

EXAMPLE XII

A crystal of $CsNO_3$ was prepared in accord with Example II being approximately 15.0 mm long, 2.0 mm wide and 0.6 mm thick. A copper wire was affixed at one end with conductive silver epoxy. The crystal was then coated with nonconductive epoxy and immersed into Liquid Nitrogen. A voltage pulse, measured by an oscilloscope, having a duration of about 0.25 microsecond and amplitudes up to about 4.0 volts was emitted.

EXAMPLE XIII

A crystal of $CsNO_3$ was prepared in accord with Example II being approximately 4.0 mm long, 1.0 mm wide and 1.0 mm thick. The crystal was coupled with epoxy to one end of a fiber optic cable approximately 2.0 meters long. The crystal was immersed in liquid nitrogen, and a spontaneously generated light pulse was measured at the end of the optic cable with photometric tubes.

I claim:

1. A method of generating a force field comprising:
   electrically insulating a cryogenic field material; and
   cooling said material to a temperature below about 110K.

2. The method of claim 1 wherein the force field comprises an electric field.

3. The method of claim 1 wherein the temperature is below about 85K.

4. The method of claim 1 wherein the cryogenic field material maintains a stable polarized field for more than about 5 seconds.

5. The method of claim 4 wherein a stabilized field is maintained for more than about one minute.

6. The method of claim 5 wherein a stabilized field is maintained for more than about one hour.

7. The method of claim 1 wherein said cryogenic field material is a crystal selected from a hydrate of potassium tartrate, cadmium nitrate and thorium nitrate.

8. The method of claim 7 wherein said crystal is selected from potassium tartrate hemihydrate, potassium tartrate dihydrate, cadmium nitrate tetrahydrate and thorium nitrate tetrahydrate.

9. The method of claim 7 wherein said force field comprises at least one of electric and mass attraction force fields.

10. The method of claim 9 wherein said temperature is below about 85K.

11. The method of claim 9 wherein said force field comprising cryogenic filed materials is maintained at low temperature.

12. The method of claim 1 wherein said cryogenic field material is a crystal selected from cesium nitrate, rubidium nitrate and tartaric acid.

13. The method of claim 1 wherein the force field comprising cryogenic material is maintained at low temperature.

14. The method of claim 4 wherein a stabilized field is maintained for more than about a day.

15. The method of claim 4 wherein a stabilized field is maintained for more than about a week.

* * * * *